United States Patent [19]
Ebel et al.

[11] 4,064,290
[45] Dec. 20, 1977

[54] SYSTEM FOR COATING PLATED THROUGH HOLE SURFACES

[76] Inventors: Julius Alex Ebel, 5334 Pamela Kay Lane, Anaheim, Calif. 92806; Ernest H. Mitchell, 3313 S. Timber, Santa Ana, Calif. 92707

[21] Appl. No.: 385,950

[22] Filed: Aug. 6, 1973

Related U.S. Application Data

[63] Continuation-in-part of Ser. No. 148,261, May 17, 1971, abandoned.

[51] Int. Cl.² .................. B05D 1/32; B05D 5/12
[52] U.S. Cl. .................................. 427/97; 427/256; 427/259; 427/277; 427/355; 427/356; 427/358; 427/372 R; 427/385 R; 427/388 R
[58] Field of Search ............... 117/212, 5.5, 38, 66, 117/102, 95; 427/97, 96, 271, 277, 256, 259, 355, 356, 358, 372 R, 385 R, 388 R

[56] References Cited

U.S. PATENT DOCUMENTS

| | | | |
|---|---|---|---|
| 3,268,653 | 8/1966 | McNutt | 117/212 |
| 3,340,607 | 9/1967 | Shutt | 117/212 |
| 3,776,771 | 12/1973 | Shephard | 117/212 |

OTHER PUBLICATIONS

Haddad, *Coating of Through Hole Dielectric Substrates,* IBM Tech. Discl., vol. 9, No. 3, p. 227 (1966).

*Primary Examiner*—Michael F. Esposito
*Attorney, Agent, or Firm*—Nilsson, Robbins, Dalgarn, Berliner, Carson & Wurst

[57] ABSTRACT

A system is disclosed for coating the interior surfaces of plated through holes in printed circuit boards by flowing a minimal volume of a low viscosity fluid carrying resist solids through holes in a board. After coating, the liquid phase of the fluid is evaporated, leaving a protective solid coating adhered to the walls of the plated through holes. The system enables positive imaging of the printed circuit boards preparatory to etching.

6 Claims, 3 Drawing Figures

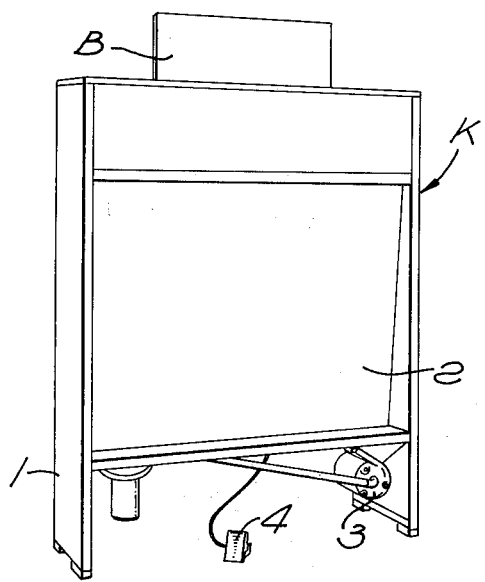
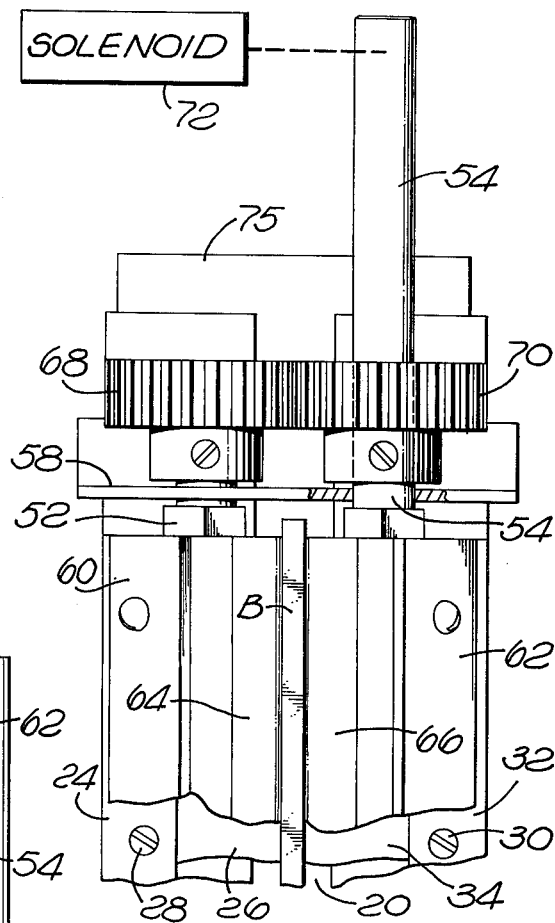
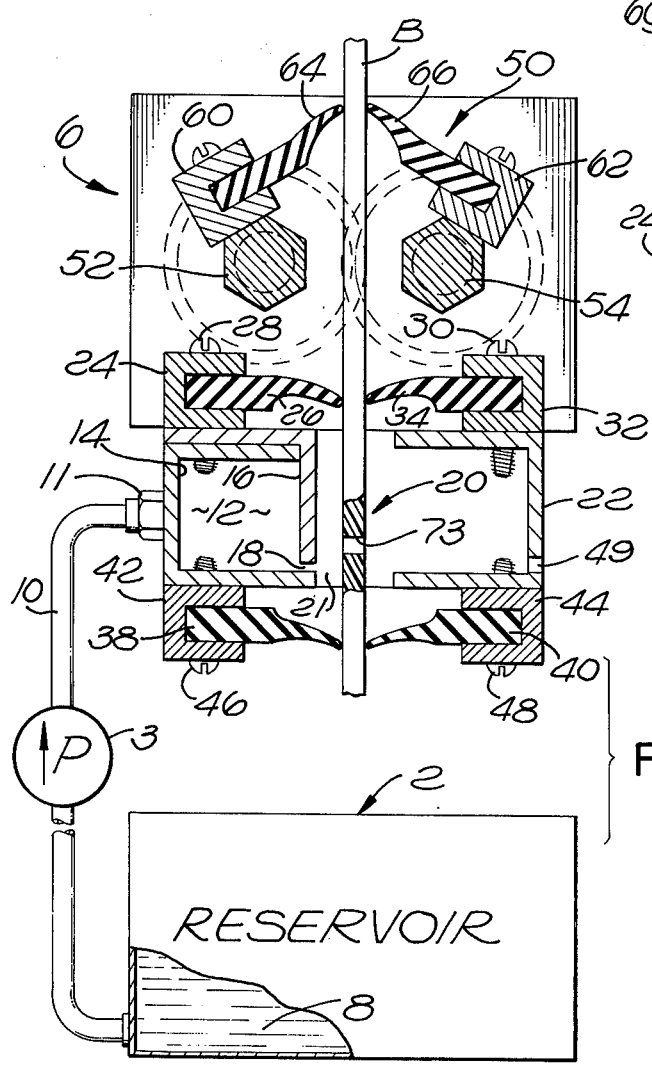

4,064,290

SYSTEM FOR COATING PLATED THROUGH HOLE SURFACES

BACKGROUND OF THE INVENTION

This is a continuation-in-part of a copending application Ser. No. 148,261, filed May 17, 1971 now abandoned, and entitled METHOD FOR COATING PLATED THROUGH HOLES IN PRINTED CIRCUIT BOARDS.

FIELD OF THE INVENTION

The present invention relates to a system for effectively shielding the interior surfaces of plated-through holes in printed circuit boards against etch-out.

DESCRIPTION OF THE PRIOR ART

Two sided printed circuit boards are known, in which the plated-through holes interconnect the circuits on opposed sides of the board. Of course, improved utilization results from the use of both sides of the printed-circuit board.

The manufacture of printed circuit boards with plated through holes involves drilling a specified hole pattern in a sheet of fiberglass epoxy or phenolic, having copper foil laminated to both sides. Next, the non-conductive walls of the holes are sensitized preparatory to plating, after which they are termed "plated thru-holes". Conventionally, the board next receives resist ink or photo resist in the pattern of either a negative or positive image of the desired circuit. In the case of the negative image, the circuit, holes and pads are bare to receive a plated cover, as of solder. After the solder-plating, the resist (which served to define the circuitry pattern) is stripped off and the bare copper of the exposed surfaces is etched away with etchant, e.g. acid as indicated, leaving the plate-covered copper circuit.

Some applications require solder-plated boards, as described above, but the solder-plating process is complex and expensive. Accordingly, it is desirable to avoid it in many applications, as by use of the silk screen process. In that process, for example, a positive image of the circuit is screened on the board in acid-resist ink so that the remaining copper clad can be etched away. Of course, the copper lining holes through a board must be protected during the etching step. Prior practice has been to plug the holes as by use of a conventional roller coater to force a thick ink paste into the plated holes, in theory, filling them completely, so that during the etching step, the copper plated walls of the holes would be protected.

Unfortunately, hole plugging techniques have not proven to be completely reliable. Upon drying, the paste tends to shrink away from the walls, permitting acid to attack the copper plate and in many cases causing the loss of a board. Additionally, the thick ink paste often leaves an undetectable air bubble trapped in the hole which may result in exposure of the hole wall to acid. As a consequence of these and other problems, a substantial need exists for an improved system to shield the internal plated walls of holes in printed circuit boards, as during etching operation.

SUMMARY OF THE INVENTION

In accordance with the system, a fluid under pressure is passed through the holes in a printed circuit board, to dislodge any foreign particles (including air) and coat the entire internal surface of each hole. Subsequently, upon evaporation of the liquid phase, a protective coating of solids remains, forming a ring, firmly adhered to the rough walls of each hole in a printed circuit board. The fluid is of light viscosity and carries solid resist material dissolved or suspended therein.

One embodiment of the invention includes a pressurized flow coating system, a reservoir for holding the fluid, a pump and cooperating wipers. The pressurized coating system comprises two holding members having channels to define flow passages facing each other and with four flexible seals coupled to the four defined edges of the two channels so as to define a leakproof chamber. As the printed circuit board passes between the flexible seals, two individual chambers are formed: one becomes a pressure chamber (receiving fluid) and the other serves as a receiver. The fluid flows through the holes of the board from which it clears foreign matter and wets the internal surfaces.

After the holes of the boards are coated, the planar surfaces are wiped clean. Subsequently, the boards should be held essentially erect while drying. The surface tension of the fluid causes it to adhere to the walls of the holes so that it dries as a relatively even covering.

DRAWING SUMMARY

The following detailed description should be read in conjunction with the drawings as follows:

FIG. 1 is a perspective view of a unit constructed in accordance with the present invention;

FIG. 2 is a diagrammatic and vertical sectional view through a major operating component of the unit of FIG. 1; and FIG. 3 is a fragmentary plan view of the structure of FIG. 2.

DESCRIPTION OF THE ILLUSTRATIVE EMBODIMENT

The disclosed embodiment exemplifies the invention in what is presently considered the best mode of operation for that purpose recognizing, of course, that the invention may be embodied in various other forms some of which may be radically different from the illustrative embodiment. However, the specific structural and functional details disclosed herein are representative and provide the basis for the claims herein which define the scope of the invention.

Referring initially to FIG. 1, there is shown a unit constructed in accordance with the present invention for providing a shield coating on the internal surfaces of holes in printed circuit boards. Specifically, the unit K receives a board B through an opening (not shown) at the top. Streams of fluid pass through holes in the board B, which streams purge the holes of foreign matter and leave a residue, which on evaporation of the liquid phase becomes a protective shield for the walls of the holes.

The unit K includes a support stand 1 for a reservoir tank 2. A pump 3 circulates the coating liquid from the tank 2 for passage through the board B. Operating components as considered in detail below are controlled by a foot switch 4. Thus, the unit is operated by inserting a board B, actuating the foot switch 4 and withdrawing the board. After a curing period (preferably in a substantially vertical position) the holes of the board B are coated with a solid resist.

Reference now should be made to FIG. 2 which illustrates a major operating mechanism 6 located generally in the upper portion of the unit K. The mechanism 6 is oriented horizontally and is connected to receive fluid 8 from the tank 2 (symbolically represented) through a duct 10 including the pump 3 (symbolically represented). Flow of the fluid 8 is from the duct 10 through a fitting 11 into an elongated square-section pressure chamber 12 (left) defined by the mated engagement of a length 14 of channel stock with a length 16 of angle stock. The engagement between the lengths 14 and 16 defines an elongate slot 18 through which liquid exits from the chamber 12.

Upon passing from the chamber 12, liquid flows into a somewhat closed space 20 which receives the board B. Opposed to the length 16, a length 22 of channel stock is mounted. The ends of the lengths 14, 16 and 22 are closed by mounting blocks 75 (FIG. 3).

The upper and lower surfaces of the length 22 as well as those of the mated combination lengths 14 and 16 support flexible seals to further close the space 20. Specifically, a channel clamp 24 receives a matingly-received elongate wiper or seal 26 which is adhesively fixed in position. Also, the clamp 24 receives self-threading screws 28 for closure on the seal 26 and for affixing that combination to the lengths 14 and 16. Somewhat similarly, at the opposite side of the mechanism 6, screws 30 pass through a channel clamp 32 and a received flexible blade or seal 34 to be received in the length 22. Thus, the seals 26 and 34 are held in faced closing relationship. In a similar manner, another pair of resiliently-deformable, elongate seals 38 and 40 are supported in facing engagement at the bottom of the space 20, by a pair of channel clamps 42 and 44, respectively, which are in turn fixed to the undersides of the channel lengths 14 and 22, respectively, by screws 46 and 48. It may, therefore, be seen that when there is no board B in the space 20, liquid may simply pass between the seals 38 and 40 to return to the tank 2. Alternatively, with a board B inserted, as illustrated, the space 20 is divided to provide a pressure space 21 so that a pressure differential is developed across the board B to force fluid flow through the board B. Excessive pressures are relieved through the seals 38 and 44 and fluid is drained from the other side of the board, as through holes 49. However, it is to be noted that the ends of both the elongate structures are closed by the blocks 75 (FIG. 3).

The mechanism 6 also includes a wiper structure 50, which is mounted above the seals 26 and 34. Specifically, a pair of elongated parallel shafts 52 and 54 are rotatably mounted, at their ends, in bearing blocks 58 (FIG. 3). Elongated channel clamps 60 and 62 are affixed to the shafts 52 and 54, respectively, carrying opposed wiper blades 64 and 66. At one end, the rotatably-mounted shafts 52 and 54 are mechanically coupled by gear wheels 68 and 70, the latter of which is connected for actuation by a solenoid 72 under control of the foot switch 4 (FIG. 1).

Of course, the present invention can be variously embodied; however, it has been found effective, economical and practical to employ somewhat standard aluminum extrusion forms for the elongate members, e.g. lengths 14 and 16, channel clamps 24, 32 and so on. These members are fixed into the integral operating components as described above, which are subsequently assembled by attachment to the bearing blocks 58 (FIG. 3) and closure blocks 75. Subsequently, the gear wheels 68 and 70 are attached, along with the solenoid 72.

Upon completion of the major operating mechanism 6 (FIGS. 2 and 3) that structure is simply mounted in the stand 1 (FIG. 1) along with the assembly including the pump 3 and the tank 2. It has been determined to be important that the elongate operating mechanism 6 be supported with its length extending horizontal. Electrical apparatus may include a float, level indicating signal, as well as an "on-off" switch and apparatus incorporating the foot switch 4, all as well known in the art. Final preparation involves placing the fluid 8 in the tank 3. Various substances can be employed; however, certain characteristics are somewhat critical. Specifically, the fluid must be of a low viscosity, it must adhere to the surfaces of the holes 73 and it must include a liquid phase that will evaporate to leave a solid residue.

Considering the operation of the unit K, the pump 4 (FIG. 1) continually recirculates the fluid 14 during active periods. When no printed circuit board B is in the unit K, the liquid simply passes back to the reservoir tank 2. Upon insertion of a printed circuit board B fluid is pumped from chamber 12 through the exit slot 18 into the subspace 21 of the space 20, formed when the printed circuit board B is inserted. The fluid under pressure passes through holes 73 in the printed circuit board B and returns to the tank 2 as described previously.

The fluid passing through the holes 73, dislodges any foreign particles as well as air bubbles, and coats the entire surface of each hole 73. Excess fluid is removed from the planar surfaces of the printed circuit board B upon withdrawing the printed circuit board B between wiper blades 64 and 66 (FIG. 2).

After passing through the wipers 64 and 66, the printed circuit board B should be held essentially erect to retain the fluid in the holes 73 by surface tension. The board B is then dried, curing the fluid to a solid coating.

In the practice of the system of the present invention, several parameters are quite significant. First, it is important that flow of the fluid 8 actually be established through the holes 73 to remove air and foreign particles. In practice a substantial flow has been employed; however, on the basis of analysis it has been established that a volume of fluid not less than three times the volume defined within the hole should flow into each hole. That is, for effective purging of the hole, a fluid flow of at least triple the volume defined by the hole should pass into the hole. Thus, the holes are reliably filled exclusively with fluid.

With regard to the fluid 14, certain characteristics have been determined as somewhat critical. Specifically, the fluid must have a tendency to adhere to metal, e.g. the metallic walls of the holes. Furthermore, the fluid should be of low viscosity. Specifically, in the latter regard, it has been determined to be important to utilize a fluid having a viscosity of between about 4.0 cps. and about 5,000 cps. However, somewhat ideal results have been attained using a fluid having a viscosity of about 20 to 50 centipoises (at room temperature) having dissolved solids that provide the actual coat or shield after evaporation of the liquid phase.

The invention has been described in detail. However, said detailed description is not intended in any way to limit the scope of the invention which is deemed to be defined by the following claims.

What is claimed is:

1. A method of coating the walls of holes through a printed circuit board to provide a resist coating on such walls comprising the steps of:

providing a fluid having a characteristic for adhering to said walls and curable to a solid coating;

flowing a stream of said fluid through said holes, which stream completely fills said holes and whereby flow is in sufficient quantity to purge air and impurity particles from said holes; and ceasing said stream of said fluid and curing such fluid as adheres to said walls to provide a coating.

2. A method according to claim 1 further including the step of wiping the plant surfaces of said printed circuit board prior to curing of fluid thereon.

3. A method according to claim 1 wherein said fluid has a viscosity between about 20 and about 50 centipoises.

4. A method according to claim 1 wherein said walls comprise metallic surfaces.

5. A method according to claim 1 wherein said printed circuit board is maintained generally vertical to provide said holes horizontal during a further step of curing said fluid.

6. A method according to claim 1 wherein at least a quantity of fluid equal to three times the volume of said holes flows through said holes.

* * * * *